US006614109B2

(12) United States Patent
Cordes et al.

(10) Patent No.: US 6,614,109 B2
(45) Date of Patent: Sep. 2, 2003

(54) METHOD AND APPARATUS FOR THERMAL MANAGEMENT OF INTEGRATED CIRCUITS

(75) Inventors: Michael James Cordes, Newburgh, NY (US); Steven Alan Cordes, Cortlandt Manor, NY (US); Uttam Shyamalindu Ghoshal, Austin, TX (US); Errol Wayne Robinson, Fishkill, NY (US); James Louis Speidell, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/498,826

(22) Filed: Feb. 4, 2000

(65) Prior Publication Data

US 2002/0113289 A1 Aug. 22, 2002

(51) Int. Cl.$^7$ ........................... H01L 23/34; H01L 35/04
(52) U.S. Cl. ........................ 257/712; 257/719; 136/203
(58) Field of Search ........................ 257/706, 712–722; 136/201, 203, 236, 241, 224, 225, 237, 238, 240

(56) References Cited

U.S. PATENT DOCUMENTS

| | | | |
|---|---|---|---|
| 5,040,381 A | | 8/1991 | Hazen ........................... 62/3.2 |
| 5,229,327 A | | 7/1993 | Farnworth .................... 437/209 |
| 5,233,622 A | | 8/1993 | Iwamoto ....................... 372/34 |
| 5,637,921 A | * | 6/1997 | Burward-Hoy ............... 257/712 |
| 5,712,448 A | * | 1/1998 | Vandersande et al. ........ 136/203 |
| 5,724,818 A | | 3/1998 | Iwata et al. .................... 62/3.7 |
| 5,874,775 A | | 2/1999 | Shiomi et al. ................ 257/712 |
| 5,956,569 A | * | 9/1999 | Shiu et al. .................... 438/48 |
| 6,121,539 A | * | 9/2000 | Johnson et al. .............. 136/203 |
| 6,222,113 B1 | * | 4/2001 | Ghoshal ....................... 136/201 |

FOREIGN PATENT DOCUMENTS

| | | | | |
|---|---|---|---|---|
| GB | 2097184 | | 10/1982 | ........... H01L/35/00 |
| JP | 5-102536 | * | 4/1993 | ........... H01L/35/32 |
| WO | WO 99/50910 | | 10/1999 | ........... H01L/23/38 |

OTHER PUBLICATIONS

Tony Kontzer, *Can Chip Hot Spots be Cooled Efficiently?*, Informationweek.com NewsFlash, Monday, Mar. 26, 2001, wysiwyg://2/http://www.informationweek.com/story/1WK20010326S00, pp 1–2.

* cited by examiner

*Primary Examiner*—Ori Nadav
(74) *Attorney, Agent, or Firm*—Duke W. Yee; Casimer K. Salys; Stephen J. Walder, Jr.

(57) ABSTRACT

Method and apparatus for thermal management of an integrated circuit. A semiconductor device includes an integrated circuit and an integrated thermoelectric cooler formed on a common substrate. A semiconductor device is fabricated by forming an integrated circuit on a front side of the substrate and forming an integrated thermoelectric cooler on a back side of the substrate. A first thermal sink of semiconductor material capable of absorbing heat from the integrated circuit is formed on the back side of the substrate. N-type thermoelectric elements are formed on contacts formed on the first thermal sink. P-type thermoelectric elements are formed on contacts formed on a second thermal sink of semiconductor material capable of dissipating heat. The p-type and n-type thermoelectric elements are bonded to the contacts on the first and second thermal sinks, respectively, by a flip-chip soldering process. Using this method, semiconductor devices including an integrated circuit and integrated modules of thermoelectric elements are formed having cooling capacities corresponding to heat dissipated from different portions of the integrated circuit. As a result, substantially uniform temperature distribution across the integrated circuit can be achieved.

14 Claims, 3 Drawing Sheets

METHOD AND APPARATUS FOR THERMAL MANAGEMENT OF INTEGRATED CIRCUITS

FIELD OF THE INVENTION

The present invention generally relates to thermoelectric cooling. More particularly, the invention is directed to methods for fabricating semiconductor devices having integrated circuits and integrated thermoelectric coolers for thermal management of the integrated circuits and semiconductor devices made from such methods.

BACKGROUND OF THE INVENTION

Sub-ambient cooling is conventionally accomplished through gas/liquid vapor phase compression based refrigeration cycles using Freon type refrigerants to implement the heat transfers. Such refrigeration systems are used extensively for cooling human residences, perishable items, and vehicles. Sub-ambient cooling is also often used with major electronic systems such as mainframe, server and workstation computers. Though vapor compression cooling can be very efficient, it does require significant moving hardware. Vapor compression cooling systems, at a minimum, include a compressor, a condenser, an evaporator, and related coolant transfer plumbing. As a result of the complexity and associated high cost, vapor compression cooling has not found material acceptance in small cooling applications, such as personal computers, integrated circuits, etc.

The fact that CMOS logic can operate significantly faster as the temperature decreases has been well known for many years. For example, when CMOS logic devices are operated at −50° C. their performance is improved by 50 percent over room temperature operation. Liquid nitrogen operating temperatures, in the range of −196° C., have shown 200 percent performance improvements. Similar benefits have been shown to accrue for integrated circuit wiring, where metal wiring resistance decreases by a factor of 2 for integrated circuits operated at −50° C. in comparison to room temperature operation. These performance improvements rival the recent technological breakthrough of using copper wiring in integrated circuits to reduce interconnect resistance and thereby effectively increase the operating frequencies attainable. Thus, sub-ambient temperature operation of integrated circuit logic devices, such as field effect transistors, as well as interconnect wiring can improve integrated circuit performance. This performance enhancement then poses the question of how to accomplish such cooling in the confines of the ever decreasing size and materially shrinking cost environment of microelectronics.

FIG. 1 schematically depicts a conventional Peltier type thermoelectric element (TE) 1 with DC power supply 2 creating the electric field across TE 1 while at a load current 3. The desired heat transfer is from cold sink 4, at temperature $T_{cold}$, to hot sink 6, at temperature $T_{hot}$. As indicated in the equation of FIG. 1, the net heat energy transported is composed of three elements, the first representing the Peltier effect (thermoelectric) contribution, the second defining negative Joule heating effects, and the third defining negative conductivity effects. The thermoelectric component is composed of the Seebeck coefficient, the temperature of operation ($T_{cold}$) and the current being applied. The Joule heating component reflects that roughly half the Joule heating goes to the cold sink and remainder to the hot sink. Lastly, the negative component attributable to thermal conduction represents the heat flow through the Peltier device, as defined by the thermal conductivity of the Peltier device, from the hot sink to the cold sink. See equation (1).

$$q = \alpha T_{cold} I - (\tfrac{1}{2}) I^2 R - K \Delta T \tag{1}$$

International Business Machines (IBM) Corporation, assignee of the present invention, has made advances with thin film implementations and miniaturization of thermoelectric coolers. See U.S. patent application Ser. No. 09/458,270 having the title "Electrically-Isolated Ultra-Thin Substrates For Thermoelectric Coolers" and U.S. patent application Ser. No. 09/458,271 having the title "Thermoelectric Cooling Apparatus And Method For Maximizing Energy Transport" both applications of which are hereby incorporated by reference. Thin film implementations and miniaturization of thermoelectric coolers provides high cooling flux scaling with the smaller geometries to provide cooling in the range of 2–3 W/cm$^2$ to 100 W/cm$^2$ with high entropy gradients and lower thermal conductivities. Use of thin film implementations yields higher reliability MTBF (mean time between failures) of greater than 10$^6$ hours, lower cost in the order of less than 100¢/W and ease of constructing multistage configurations wherein nanoscopic coolers can be operated in parallel for large cooling capacity and high efficiency.

With these advances many problems can be solved. One such problem is thermal management across an integrated circuit such as a relatively large processor chip. For example, in operation, most processor chips have nonuniform temperature distribution across the chip wherein the portion of the chip having the Arithmetic Logic Unit (ALU) may operate at one temperature while the portions of the chip having the cache or cache interfaces may operate at another temperature. Nonuniform temperature distribution across the chip presents a myriad of problems including problems with performance, processing speed and reliability. To avoid these problems, uniform temperature distribution across the chip is needed.

Present methods for addressing the problem of thermal management of integrated circuits and associated problems such as described above have proven to be costly and difficult to implement. Thus a need exists for an improved low cost method of addressing these problems by cooling integrated circuits using, in part, the advances made by IBM Corporation with thin film implementations and miniaturization of thermoelectric coolers as mentioned above.

SUMMARY OF THE INVENTION

The present invention provides for an improved low cost method of fabricating a semiconductor device having integrated circuits and integrated thermoelectric coolers for cooling the integrated circuits and a semiconductor device made using such method.

In one form, the invention relates to a method of fabricating a semiconductor device comprising forming an integrated circuit on a front side of a substrate and forming an integrated thermoelectric cooler capable of cooling the integrated circuit on a back side of the substrate.

In another form, the invention relates to a semiconductor device made using the method described above comprising a substrate having a front side and a back side, an integrated circuit formed on the front side of the substrate and an integrated thermoelectric cooler formed on the back side of the substrate capable of cooling the integrated circuit.

In one particularized form of the invention, a composite semiconductor device structure is fabricated by forming an integrated circuit on a front side of a first substrate and forming an integrated thermoelectric cooler on a back side of the first substrate. A thermal sink of semiconductor material capable of absorbing heat from the integrated circuit is formed on the back side of a separate second substrate. N-type thermoelectric elements are formed on contacts connected to doped regions in the first substrate. P-type thermoelectric elements are formed on contacts connected to doped regions in the second substrate forming a thermal path of semiconductor material to a thermal sink capable of dissipating heat. The p-type and n-type thermoelectric elements are bonded to complementary contacts formed on the first and second substrates, respectively, by a flip-chip soldering process.

In yet another particularized form of the invention, a semiconductor device includes multiple thermoelectric elements formed in selective patterns to extract heat at different rates from different portions of the integrated circuit to thereby achieve substantially uniform temperature distribution across the integrated circuit.

These and other features of the invention will be more clearly understood and appreciated upon considering the detailed embodiments described hereinafter.

BRIEF DESCRIPTION OF THE DRAWINGS

Other objects, advantages, features and characteristics of the present invention, as well as methods, operation and functions of related elements of structure, and the combination of parts and economies of manufacture, will become apparent upon consideration of the following description and claims with reference to the accompanying drawings, all of which form a part of this specification, wherein like reference numerals designate corresponding parts in the various figures.

DETAILED DESCRIPTION OF A PREFERRED EMBODIMENT

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit or scope of the invention. To avoid detail not necessary to enable those skilled in the art to practice the invention, the description may omit certain information known to those skilled in the art. The following detailed description is, therefore, not to be taken in a limiting sense, and the scope of the present invention is defined only by the appended claims.

The conceptual ground work for the present invention involves fabricating a semiconductor device having an integrated circuit and an integrated thermoelectric cooler for cooling the integrated circuit on a common substrate using low-cost semiconductor fabrication processes such as electrochemical deposition and CMOS processing techniques. In this manner, thermal management of integrated circuits can be achieved by forming miniature integrated thermoelectric coolers at the wafer level of fabrication and in patterns corresponding to the heat dissipation profiles of the integrated circuits.

Figure 2A:
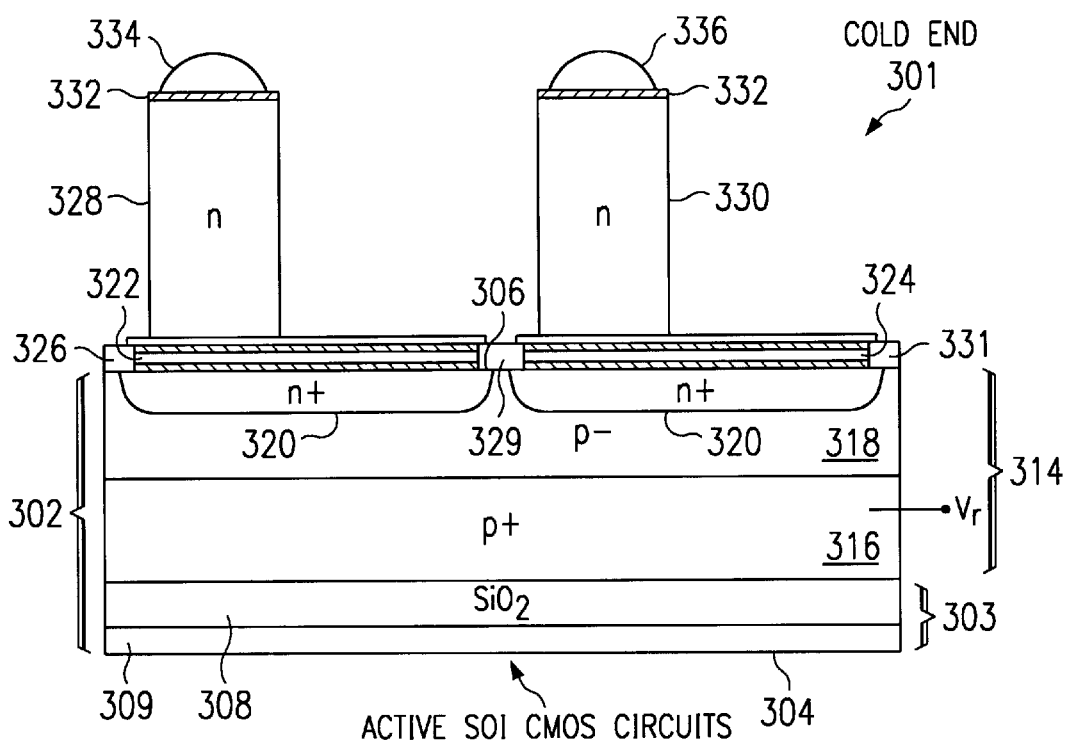
FIGS. 2A–2C illustrate a method of fabricating a semiconductor device according to a preferred embodiment of the present invention.
Figure 2B:
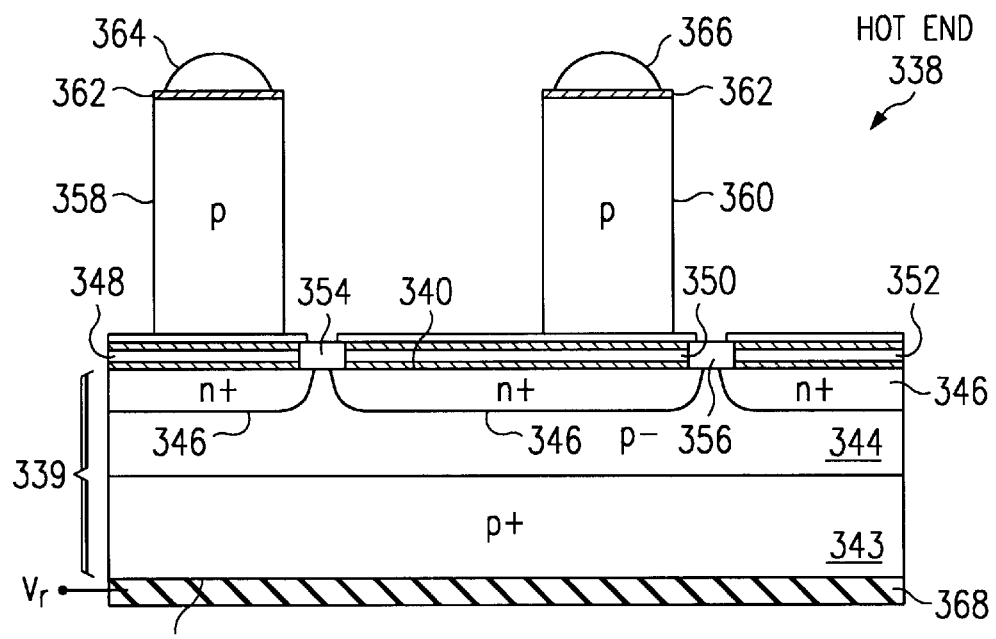
Figure 2C:
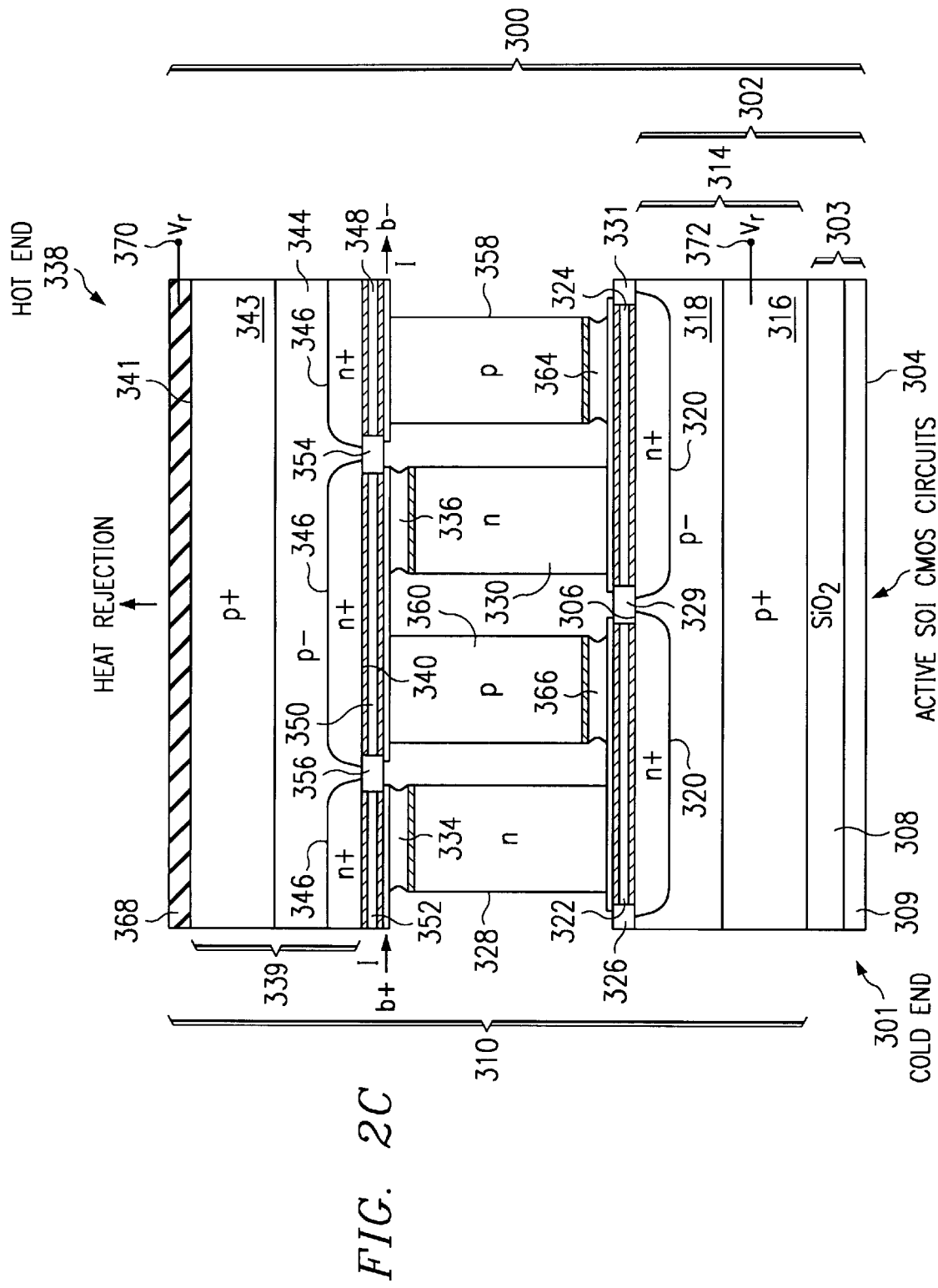

Referring now to FIGS. 2A–2C, a method of fabricating a composite semiconductor device 300 comprising an integrated circuit (IC) 303 and an integrated thermoelectric cooler 310 capable of cooling integrated circuit 303. FIGS. 2A and 2B are detailed cross-sectional views of semiconductor device 300 at two stages of the fabrication process and FIG. 2C is a detailed cross-sectional view of semiconductor device 300 at the final completed stage of the fabrication process.

Referring to FIG. 2A, fabrication of semiconductor device 300 begins in a first stage with forming a cold end 301 of device 300. A semiconductor substrate 302 of semiconductor material is selected. Semiconductor substrate 302 has a front side 304 and a back side 306. Silicon on Insulator (SOI) integrated circuit(s) 303 are formed in semiconductor layer 309 of substrate 302, and electrically isolated from the remainder of the substrate by SOI silicon dioxide ($SiO_2$) layer 308. It will be appreciated that SOI integrated circuit(s) in layer 309 may form any circuit or devices with related wiring patterns. For example, the integrated circuit(s) could be a Power PC processor available from International Business Machines Corporation of Armonk, N.Y. for use in a computer or information handling system. Together, layers 308 and 309 are approximately 0.5 microns thick. In a preferred embodiment, insulating layer 308 is silicon dioxide ($SiO_2$) formed by implanting oxygen through the surface of the front side 304 of silicon (Si) substrate 302 followed by annealing.

A first thermal sink 314 of semiconductor substrate 302 absorbs thermal energy dissipated by SOI integrated circuit(s) formed in substrate layer 309. In a preferred embodiment, first thermal sink 314 created by forming an approximately 10 micron thick p+ layer 316 and an approximately 10 micron thick p– layer 318 of substrate 302. In a preferred embodiment, layer 318 is formed by counterdoping. It will be appreciated that layer 318 may also be formed by other semiconductor fabrication techniques such as epitaxial growth or diffusion. Also indicated in FIG. 2A is the presence n+ contact regions 320. In the preferred embodiment, regions 320 are formed by conventional photoresist processing to define the patterns of n+ regions 320. N+ regions 320 are then formed using ion-implantation processing techniques. The photoresist is then removed and the implanted n+ regions 320 are annealed. It will be appreciated that other methods may be employed to form n+ regions 320.

Deposited onto the surfaces of the n+ regions 320 is a material which is effective for electrical contacts as well as for forming thermoelectric elements thereupon. In the illustration, either a Copper (Cu) sandwiched between Platinum (Pt) or a Copper (Cu) sandwiched between Nickel (Ni) may be used. Contacts 322 and 324 are preferably formed on regions 320 by first applying and patterning photoresist, and then electroplating the Cu and Ni, and sputtering the Pt, to form the Platinum/Copper/Platinum or Nickel/Copper/Nickel layers. The contacts 322 and 324 are electrically and thermally isolated as well as stabilized by optional Silicon Dioxide (SiO$_2$) dielectric pads 329,328 and 331. Contacts 322 and 324 are formed to be approximately 15 microns thick.

N-type thermoelectric elements are created in the form of thin film sup lattice structures, as set forth in U.S. patent application Ser. No. 09/458,271 having the title "Thermoelectric Cooling Apparatus And Method For Maximizing Energy Transport." In the illustrated configuration, two n-type thermoelectric elements, 328 and 330, having lengths of approximately 30 microns are made from a composition of Bi$_2$Te$_{2.7}$Se$_{0.3}$ formed by a pulsed electrochemical deposition process wherein alternating layers of BiTe and SeTe of predetermined compositions form the desired composition of Bi$_2$Te$_{2.7}$Se$_{0.3}$. In another embodiment, elements 328 and 330 are formed by a bulk plating process. In a preferred embodiment, a layer of Platinum 332 is then deposited on the exposed ends of thermoelectric elements 328 and 330 preferably using a sputtering process. The layer of Platinum is approximately 1.5 microns thick. It will be appreciated that Nickel could be used instead of Platinum for layer 332. However, Platinum is preferred to minimize reliability problems caused by electromigration. Next, flip chip solder bumps 334 and 336 are placed or deposited on the layer of Platinum 332 on thermoelectric elements 328 and 330. Preferably, flip chip solder bumps 334 and 336 are a lower temperature solder used in CMOS fabrication processes having a 40%/20%/40% Lead/Tin/Bismuth composition.

Referring now to FIG. 2B, fabrication of composite semiconductor device 300 continues with forming, on a separate substrate and in a separate fabrication process, a hot end 338 of composite device 300. The fabrication of hot end 338 is similar in some respects to the fabrication of cold end 301. A second semiconductor substrate 339, typically at a wafer level, is the starting material. Semiconductor substrate 339 has a front side 340 and a back side 341. In a preferred embodiment of the invention, substrate 339 has a p+ silicon (Si) layer 343. A thermal sink is formed by connecting substrate 339 to a layer 368 of metal or other medium capable of dissipating heat energy. In a preferred embodiment, thermal sink 339 with a 10 micron thick p+ layer 343 and an approximately 10 micron thick p− material layer 344 in composite substrate 339. In a preferred embodiment, layers 343 and 344 are formed by counterdoping a p+ substrate 339. It will be appreciated that layers 343 and 344 may also be formed by other semiconductor fabrication techniques such as epitaxial growth or diffusion. Also indicated in FIG. 2B is the presence n+ regions 346. In the preferred embodiment, regions 346 are formed by conventional photoresist processing of a mask followed by ion-implantation. The photoresist mask is then removed and the implanted n+ regions 346 are annealed. It will be appreciated that other methods may be employed to form n+ regions 346.

Deposited onto the surfaces of the n+ regions 346 is a material which is effective for electrical contacts as well as for forming thermoelectric elements thereupon. In the illustration, either a Copper (Cu) sandwiched between Platinum (Pt) or a Copper (Cu) sandwiched between Nickel (Ni) may be used. Contacts 348, 350 and 352 are preferably formed on regions 346 by applying and patterning photoresist, and then electroplating the Cu and Ni, and sputtering the Pt, to form the Platinum/Copper/Platinum or Nickel/Copper/Nickel layers. The contacts 348, 350 and 352 are electrically and thermally isolated as well as stabilized by optional Silicon Dioxide (SiO$_2$) dielectric pads 354 and 356. Contacts 348, 350 and 352 are formed to be approximately 15 microns thick.

P-type thermoelectric elements are created in the form of thin film superlattice structures, as set forth in U.S. patent application Ser. No. 09/458,271 having the title "Thermoelectric Cooling Apparatus And Method For Maximizing Energy Transport." In the illustrated configuration, two p-type thermoelectric elements, 358 and 360, having lengths of approximately 30 microns are made from a composition of Bi$_{0.5}$Sb$_{1.5}$Te$_{0.3}$ formed by a pulsed electrochemical deposition process wherein alternating layers of BiTe and SbTe of predetermined compositions form the desired composition of Bi$_{0.5}$Sb1.5Te$_{0.3}$. In another embodiment, elements 358 and 360 are formed by a bulk plating process. In a preferred embodiment, a layer of Platinum 362 is then deposited on the exposed ends of thermoelectric elements 358 and 360 preferably using a sputtering process. The layer of Platinum 362 is approximately 1.5 microns thick. It will be appreciated that Nickel could be used instead of Platinum for layer 362. However, Platinum is preferred to minimize reliability problems cause by electromigration. Next, flip chip solder bumps 364 and 366 are placed or deposited on the layer of Platinum 362 on thermoelectric elements 358 and 360. Preferably, flip chip solder bumps 364 and 366 are a low temperature solder used in CMOS fabrication processes having a 40%/20%/40% Lead/Tin/Bismuth composition. Finally, an approximately 1 micron thick Aluminum layer 368 is deposited on the back side 341 of substrate 339 to form hot side thermal sink, spreader, and conductive contact, as appropriate to the thermal objectives.

Referring now to FIG. 2C, fabrication of composite semiconductor device 300 is completed in a final stage by assembling hot end 338 shown in FIG. 2B to cold end 301 shown in FIG. 2A using a flip chip soldering process to solder or bond solder bumps 334 and 336 to contacts 352 and 350, respectively, of hot end 338 and solder bumps 364 and 366 to contacts 324 and 322, respectively, of cold end 301. As mentioned above, solder bumps 334, 336, 364, 366 are susceptible to electromigration and slow diffusion of Bi through the solder joints at the hot end 338 of the device, however, the MTBF are still much larger than that of mechanical vapor compression coolers, and in the same order as VLSI flip-chip bonds. The reliability can be improved to >10$^6$ hours by incorporating redundant circuits as described in U.S. patent application Ser. No. 09/414,334 filed Oct. 7, 1999 by common assignee herewith and having the title "Highly Reliable Thermoelectric Cooling Apparatus and Method". This application is hereby incorporated by reference.

To create a series electrical connection between each of the elements 328, 360, 330, 358, contact 352 is connected to one end of n-type element 328. The opposite end of n-type element 328 is connected to contact 322 which is also connected to one end of p-type element 360. The opposite end of p-type element 360 is connected to contact 350 which is also connected to one end of n-type element 330 whose opposite end is connected to contact 324. Contact 324 is connected to one end of p-type element 358 whose opposite end is connected to contact 348 in order to complete the series connection. This series connection allows current to flow through contact 352 and reflowed solder bump 334, down n-type element 328, through contact 322, up reflowed solder bump 366 and p-type element 360, through contact 350, down reflowed solder bump 336 and n-type element 330, through contact 324, up reflowed solder bump 364 and p-type element 358, and through contact 348 to transfer heat from thermal sink 314 to thermal sink 342. Properly applying a DC voltage enables integrated thermoelectric cooler 310 to transfer thermal energy from the SOI integrated circuits formed in and onto layer 309.

The n+/p−/p+ junctions created in thermal sinks 314, 342 form diodes and, therefore, have a reverse bias voltage and breakdown voltage associated with them. The reverse bias voltage and breakdown voltage associated with each diode is dependent on a variety of factors including doping levels. The specific values of these voltages are not significant for purposes of the present discussion.

To prevent this current leakage from occurring and thus establish electrical isolation, the n+/p−/p+ junctions are kept in a reversed biased condition. This reverse biased condition ensures that current will not be able to flow anywhere but through the intended path of contacts and thermoelectric elements. Reverse biasing of the n+/p−/p+ junctions can be achieved and maintained by applying an appropriate DC voltage to contact 370 of hot sink 338 and to contact 372 connected to p+ substrate layer 316. By applying the appropriate DC voltage at contacts 370 and 372, the reverse bias voltage of the n+/p−/p+ junctions can be maintained. Thus, voltage is applied at contacts 370 and 372 such that current will only flow along its intended thermoelectric elements 328, 360, 330 and 358 will remain electrically isolated from their ambient or environment. For further discussion see U.S. Patent application Ser. No. 09/458,270 having the title "Electrically-Isolated Ultra-Thin Substrates For Thermoelectric Coolers".

Figure 1:
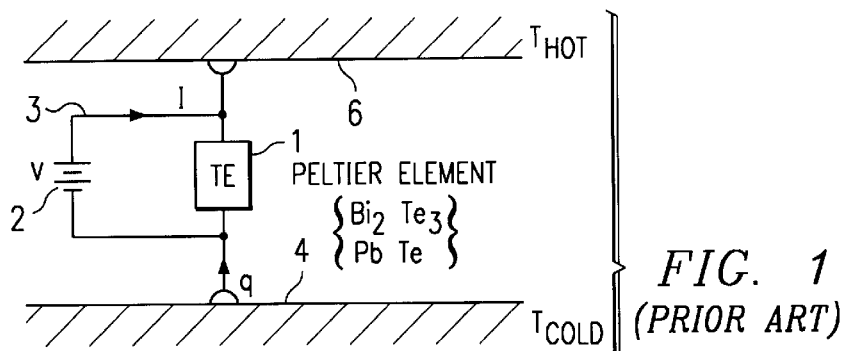
FIG. 1 schematically depicts a conventional statically operable Peltier device cooling system.
Figure 3:
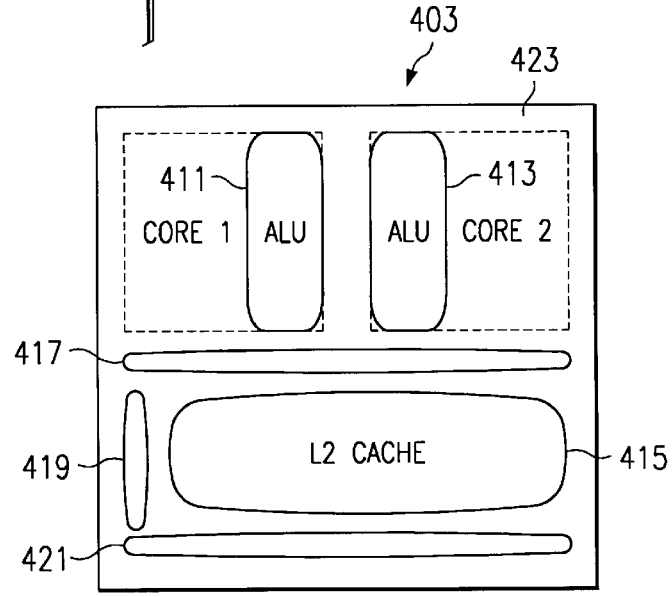
FIG. 3 illustrates a top view of an integrated circuit to be cooled according to another embodiment of the present invention.

Referring now to FIG. 3, a top view of SOI integrated circuit 403, such as would be formed in and onto layer 309, to be cooled according to one embodiment of the present invention is shown. Reference numerals used in FIG. 3 which are like, similar or identical to reference numerals used in FIG. 2 indicate like, similar or identical components. In this embodiment of the invention, integrated circuit 403 is a processor such as a Power PC processor available from International Business Machines Corporation of Armonk, N.Y. It will be appreciated, however, that any integrated circuit 403 could be used in accordance with the present invention. Processor 403 has first portions 411, 413 housing ALUs, a second portion 415 housing L2 (level two) cache memory, third portions 417, 419, 421 housing I/Os (Inputs/Outputs) and L2 Interfaces, and a fourth portion 423 of distributed logic. When powered and in operation, first portions 411, 413 dissipate a first amount of heat, second portion 415 dissipates a second amount of heat, third portions 417, 419, 421 dissipate a third amount of heat and fourth portion 423 dissipates a fourth amount of heat. In the absence of specific forms of cooling, the portions are likely to exhibit materially different temperatures while under normal operation.

Figure 4:
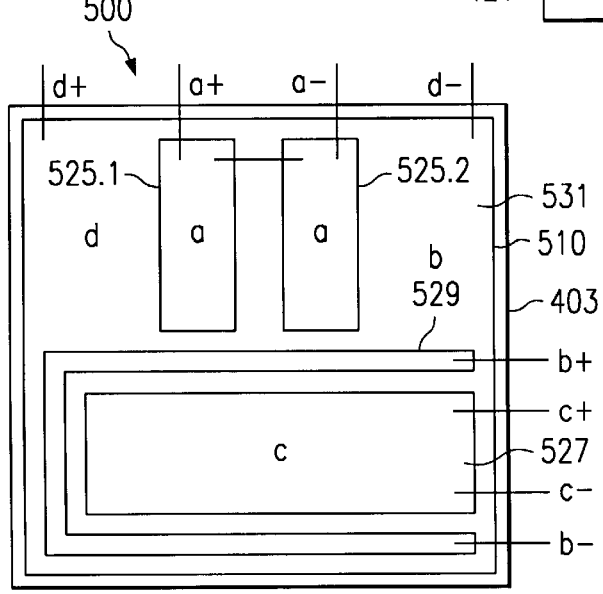
FIG. 4 illustrates a top view of a semiconductor device including the integrated circuit depicted in FIG. 3 and an integrated thermoelectric cooler capable of cooling the integrated circuit according to another embodiment of the present invention.

Referring now to FIG. 4, a top view of a semiconductor device 500 including integrated circuit 403 depicted in FIG. 3 and an integrated thermoelectric cooler 510 capable of cooling integrated circuit 403 according to another embodiment of the present invention is shown. Integrated thermoelectric cooler 510 comprises a plurality of modules of p-type and n-type thermoelectric elements 525.1, 525.2, 527, 529 and 531 capable of cooling first portions 411, 413, second portion 415, third portions 417, 419, 421 and fourth portion 423 of integrated circuit 403, respectively. The modules are fabricated to have cooling capacities matching the heat dissipation of the juxtaposed integrated circuits. In a preferred embodiment, first, second, third and fourth cooling capacities are proportional to heat generated by first portions 411, 413, second portion 415, third portions 417, 419, 421 and fourth portion 423, respectively. Also in a preferred embodiment, bias currents through a +a-corresponding the first cooling capacity are applied to modules 525.1 and 525.2, second bias currents through b+b-corresponding to the second cooling capacity are applied to module 527, third bias currents through c+c-corresponding to the third cooling capacity are applied to module 529 and a fourth bias currents through d+d-corresponding to the fourth cooling capacity is applied to module 531. Cooling capacity of modules 525.1, 525.2, 527, 529 and 531 can, in addition to bias currents, be varied based upon other factors such as the pitch and size of the array of thermoelectric elements used therein (i.e., the number of thermoelectric elements/area), the sizes of the contacts, and the individual sizes of the miniature thermoelectric elements used to form the array.

The present invention has very broad applicability. A semiconductor device and method of fabricating a semiconductor device comprising a substrate having a front side and a back side, an integrated circuit formed on the front side of the substrate and an integrated thermoelectric cooler formed on the back side of the substrate for cooling the integrated circuit using low cost semiconductor fabrication processes allows for thermal management of integrated circuits at the time of manufacture of the integrated circuits.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included with in the spirit and scope of the invention.

What is claimed is:

1. A semiconductor device comprising:
    a substrate of semiconductor material having a front side and a back side;
    an integrated circuit formed in the front side of the substrate; and
    an integrated thermoelectric cooler having connections between elements composed of doped regions in the semiconductor material formed in the back side of the substrate and being capable of cooling the integrated circuit;
    wherein the integrated thermoelectric cooler comprises a plurality of modules each of which is capable of cooling a respective portion of the integrated circuit, and wherein each of the plurality of modules have cooling capacities complementing the heat dissipation of corresponding respective portions of the integrated circuit wherein the integrated thermoelectric cooler includes a first thermal sink of semiconductor material formed on the substrate capable of absorbing thermal energy, and wherein the integrated thermoelectric cooler further includes one or more contacts formed on the first thermal sink and one or more thermoelectric elements of a first type formed on the one or more contacts formed on the first thermal sink.

2. The semiconductor device, as claimed in claim 1, wherein the first thermal sink includes a plurality of doped regions of semiconductor material.

3. The second conductor device, as claimed in claim 2, wherein the plurality of doped regions from one or more diodes.

4. The semiconductor device, as claimed in claim 1, wherein the integrated thermoelectric cooler further includes a second thermal sink of semiconductor material capable of dissipating thermal energy.

5. The semiconductor device, as claimed in claim 4, wherein the second thermal sink includes a plurality of doped regions of semiconductor material.

6. The semiconductor device, as claimed in claim 5, wherein the second thermal sink includes one or more diodes formed in the plurality of doped regions.

7. The semiconductor device, as claimed in claim 4, wherein the integrated thermoelectric cooler further includes one or more contacts formed on the second thermal sink and one or more thermoelectric elements of a second type formed on the one or more contacts formed on the second thermal sink.

8. A semiconductor device comprising:
- a substrate of semiconductor material having a front side and a back side;
- an integrated circuit formed in the front side of the substrate; and
- an integrated thermoelectric cooler having connections between elements composed of doped regions in the semiconductor material formed in the back side of the substrate and being capable of cooling the integrated circuit, wherein the integrated thermoelectric cooler includes a first thermal sink of semiconductor material formed on the substrate capable of absorbing thermal energy, and wherein the integrated thermoelectric cooler further includes one or more contacts formed on the first thermal sink and one or more thermoelectric elements of a first type formed on the one or more contacts formed on the first thermal sink.

9. The semiconductor device, as claimed in claim 8, wherein the first thermal sink includes a plurality of doped regions of semiconductor material.

10. The semiconductor device, as claimed in claim 9, wherein the plurality of doped regions form one or more diodes.

11. The semiconductor device, as claimed in claim 8, wherein the integrated thermoelectric cooler further includes a second thermal sink of semiconductor material capable of dissipating thermal energy.

12. The semiconductor device, as claimed in claim 11, wherein the second thermal sink includes a plurality of doped regions of semiconductor material.

13. The semiconductor device, as claimed in claim 12, wherein the second thermal sink includes one or more diodes formed in the plurality of doped regions.

14. The semiconductor device, as claimed in claim 11, wherein the integrated thermoelectric cooler further includes one or more contacts formed on the second thermal sink and one or more thermoelectric elements of a second type formed on the one or more contacts formed on the second thermal sink.

* * * * *

UNITED STATES PATENT AND TRADEMARK OFFICE
CERTIFICATE OF CORRECTION

PATENT NO. : 6,614,109 B2
DATED : September 2, 2003
INVENTOR(S) : Cordes et al.

It is certified that error appears in the above-identified patent and that said Letters Patent is hereby corrected as shown below:

Column 5,
Line 2, after "dielectric pads", delete "329,328" and insert -- 326,329 --;

Column 8,
Line 60, after "The", delete "second conductor" and insert -- semiconductor --;

Signed and Sealed this

Eleventh Day of May, 2004

JON W. DUDAS
*Acting Director of the United States Patent and Trademark Office*